United States Patent [19]
Lillington et al.

[11] Patent Number: 5,902,417
[45] Date of Patent: May 11, 1999

[54] HIGH EFFICIENCY TANDEM SOLAR CELLS, AND OPERATING METHOD

[75] Inventors: David R. Lillington, Rancho Palos Verdes; Stephen C. Miller, Simi Valley, both of Calif.

[73] Assignee: Hughes Electornics Corporation, El Segundo, Calif.

[21] Appl. No.: 08/764,803

[22] Filed: Dec. 12, 1996

[51] Int. Cl.$^6$ .................................................. H01L 25/00
[52] U.S. Cl. ............................................................ 136/246
[58] Field of Search ............................................. 136/246

[56] References Cited

U.S. PATENT DOCUMENTS 4,328,389  5/1982  Stern et al. ............................... 136/245

FOREIGN PATENT DOCUMENTS 61 059884  8/1996  Japan .

OTHER PUBLICATIONS

Theodore G. Stern, Proceedings 18th IECEC, Orlando, Fl, pp. 1334–1338, Aug. 1983.

Beaumont, B., et al. *"A Four–Cell Photovoltaic System Based on InP and GaAs"* Sixteenth IEEE Photovoltaic Specialists, Sep. (1982) pp. 595–600.

Davies, P., et al. *"Calculations of Efficiencies Achievable Using Gallium Arsenide and Silicon Cells Mounted Together in Cavities Illuminated by Single–Stage Concentration"* Solar Energy Materials and Solar Cells, vol. 26, No. 3, Apr. (1992) pp. 203–215.

Kurtz et al., "19.6% Electron–Irradiated GaInP/GasAs Cells", *First WCPEC*, Hawaii, Dec. 5–9, 1994, pp. 2108–2111.

Chiang et al., "Large Area GaInP$_2$/GaAs/Ge Multijunction Solar Cells For Space Applications", *First WPCEC*, Hawaii, Dec. 5–9, 1994, pp. 2120–2123.

Wanlass et al., "Development of High–Performance GaInAsP Solar Cells For Tandem Solar Cell Applications", *Proceedings of the 21st IEEE Photovoltaic Specialists, Conference*, 1990, pp. 172–178.

Fan, et al., "Optimal Design of High–Efficiency Tandem Cells", *16th IEEE Photovoltaic Specialists Conference*, 1982, pp. 692–701.

*Primary Examiner*—Mark Chapman
*Attorney, Agent, or Firm*—V. D. Duraiswamy; M. W. Sales

[57] ABSTRACT

A photovoltaic device uses a spectrally selective photon partitioner such as a reflector to partition incoming sunlight which is directed towards different solar cells, depending upon its energy. Solar cells having low and high energy band gaps are used, in which low energy photons are imaged towards that cell having the lower energy band gap, whereas high energy photons are imaged towards the higher energy band gap cell. By more directly imaging photons towards those cells in which they are converted to electricity, absorption losses due to free carriers in the semiconductor layers are reduced. The spectrally selective photon partitioner allows semiconductor layers having different lattice spacings to be optically coupled.

20 Claims, 2 Drawing Sheets

HIGH EFFICIENCY TANDEM SOLAR CELLS, AND OPERATING METHOD

BACKGROUND OF THE INVENTION

1. Field of the Invention

This invention relates to solar cells, and more specifically to tandem solar cells that efficiently convert solar radiation into electrical energy.

2. Description of the Related Art

Solar cells are photovoltaic devices that use semiconductors to convert photons into electrical energy. In a semicondutor, a conduction band and a valence band are separated by an energy gap $E_g$ that varies with material composition and temperature. When a photon is absorbed by a semiconductor, an electron is promoted from the valence band into the conduction band, thereby creating a hole in the valence band. Since a hole represents the absence of an electron, it can be regarded as a positive charge carrier. When donor or n-type impurities (which increase the number of electrons available to carry current) are added to one side of a semiconductor crystal and acceptor or p-type impurities (which increase the number of holes) to the other, a p-n junction is formed that permits current flow in one direction but restrains it in the opposite direction. Thus, p-n junctions are ideal for converting solar radiation into electricity.

A photon of wavelength $\lambda$ (as measured in a vacuum) and frequency $\nu$ has an energy $h\nu = hc/\lambda$ and is generally absorbed by a semiconductor when $h\nu \geq E_g$. However, any extra energy in the photon ($h\nu - E_g$) is converted into thermal rather than electrical energy, since only one electron-hole pair can be created for each absorption event. On the other hand, a semiconductor is more transparent to wavelengths corresponding to energies less than $E_g$, since in this case the photons are not energetic enough to promote electrons from the valence band into the conduction band. Thus, no single semiconducting material can convert the entire solar spectrum into electrical energy, since the most energetic photons produce largely thermal energy and are therefore inefficiently utilized, while the least energetic photons cannot be absorbed.

By cascading the p-n junctions of different materials, however, the overall conversion efficiency can be improved.

In so-called "tandem" solar cells, a top cell having a p-n junction of a high energy band gap semiconductor intercepts the most energetic photons. Lower energy photons pass through the top cell before they enter another cell having a p-n junction of a lower energy band gap semiconductor. In this way, an additional portion of the solar spectrum is used. In tandem solar cells, tunnel junctions are often used to connect p-n junctions, so that current can pass from one cell to the next. However, in a monolithic structure, the various layers must have thermal properties and lattice spacings which are compatible with each other. Otherwise, internal strains will be introduced during the epitaxial growth process, resulting in defects which will then propagate throughout the entire structure.

An example of a tandem solar cell is the GaInP/GaAs dual junction cell grown on a GaAs substrate, which is described by S. Kurtz et al. in "19.6% Electron-Irradiated GaInP/GaAs Cells," Proceedings of 1st WCPEC (World Conference on Photovoltaic Energy Conversion), pp. 2108–2111, 1994. This tandem solar cell produced 19.6% conversion efficiency of the air mass zero (AM0) solar spectrum, which is the pure solar spectrum with no atmospheric absorption. GaInP/GaAs cells have also been grown on Ge substrates, as reported by P. K. Chiang in "Large Area GaInP$_2$/GaAs/Ge Multijunction Solar Cells for Space Applications," Proceedings of 1st WCPEC, pp. 2120–2123, 1994. Chiang et al. predict the conversion efficiency to be slightly better when the Ge is active (i.e., the Ge and GaAs layers form a third junction), than in the dual junction case in which the Ge is inactive and acts simply as a mechanical platform (26.5 vs. 24.2% for AM0 at 28° C.). This is so because the additional active layer results in more efficient use of the solar spectrum.

GaInAsP and GaInAs individually are better converters of the IR than Ge, as indicated by M. W. Wanlass et al. in "Development of High-Performance GaInAsP Solar Cells for Tandem Solar Cell Applications," Proceedings of the 21st IEEE Photovoltaic Specialists Conference, pp. 172–178, 1990. However, GaInAsP and GaInAs have lattice spacings quite different from Ge, so that it is not possible to construct a monolithic structure by simply epitaxially depositing one layer on top of another. Semiconductors having different lattice structures can be connected, however, by using transparent adhesive layers to connect semiconductor layers both mechanically and optically. (See, for example, J. C. C. Fan et al., "Optimal Design of High-Efficiency Tandem Cells," Proceedings of the 16th IEEE Photovoltaic Specialists Conference, pp. 692–704, 1982.) In this case, the cells must be connected with metallic parts such as wires or a metallic grid, rather than with tunnel junctions. However, there are intrinsic absorption losses associated with this approach. First, there are always some losses in any "transparent" adhesive layer, but more importantly, there are losses in semiconductors due to excess holes and electrons known as free carrier absorption.

A photovoltaic device which optically joins different semiconductor layers without using a transparent adhesive layer is described in U.S. Pat. No. 4,328,389 to Stern et al. In this approach, a first broadband reflector concentrates sunlight on a high energy band gap photovoltaic array that converts high energy photons into electricity. A second broadband reflector is positioned behind the first array and reflects and concentrates light that is not absorbed in the first array back through it towards a second photovoltaic array which has a low energy band gap and converts low energy photons into electricity. In this approach, however, low energy photons must pass through the first array twice before they reach the second array, resulting in absorption losses which can be significant if the density of free carriers in the first array is high. Thus, there is still a need for a tandem solar cell that reduces losses due to free carrier absorption. Further, the device of Stern et al. is only designed for use with solar concentrator systems and specifically avoids spectrally selective reflectors.

SUMMARY OF THE INVENTION

The present invention is a high efficiency photovoltaic device in which photons are directed towards different solar cells depending upon their wavelength. Absorption losses are reduced since photons are imaged towards those semiconductor layers that convert them into electricity.

The invention includes preferably two solar cells which have different effective band gaps and are designed to efficiently convert either high or low energy photons into electricity. A spectrally selective reflector is placed between incoming photons and one of the two solar cells, designated as the first solar cell, and is preferably applied directly as a coating to the first solar cell or to a layer of substantially transparent glass which is joined to the first solar cell by an adhesive. The spectrally selective reflector transmits photons with the proper energy into the first solar cell, while reflecting photons that can be efficiently converted by the second solar cell towards that cell. In this way, high and low energy photons are imaged directly towards solar cells having high and low energy effective band gaps, respectively. This results in a higher overall solar energy to electrical energy conversion efficiency, since low energy photons do not pass through layers of high band gap semiconductor material where they might be absorbed. Furthermore, it is not necessary to use adhesive layers to connect semiconductor layers having different lattice constants, as is the case in many tandem cell configurations.

One advantage of the invention is that it allows low cost substrates to be used, since a single monolithic structure incorporating both high and low energy band gap materials is not required. For example, Ge can be used as the substrate for a high energy band gap GaInP/GaAs cell rather than costly low doped GaAs, which would otherwise be required in a stacked approach to reduce IR absorption. GaInAsP or GaInAsP/GaInAs can be used as the low band gap material, with InP used as the substrate. Ge or Si may also be used in a "lattice mismatched" configuration.

In one embodiment, the solar cells and the spectrally selective reflector are combined with a substantially flat broadband mirror that faces the radiation source and images incoming photons towards the spectrally selective reflector. This configuration allows for greater radiation shielding of the invention, which is important in space where solar cells can encounter a variety of high energy particles that cause degradation in power output over the operating life of a satellite. Further, the modular design of the invention allows it to be compactly stowed for launch and then deployed in space. The invention may be integrated in either space or on the ground with a solar concentrator system for focusing solar radiation.

Further features and advantages of the invention will be apparent to those skilled in the art from the following detailed description, taken together with the accompanying drawings.

DETAILED DESCRIPTION OF THE INVENTION

Figure 1:
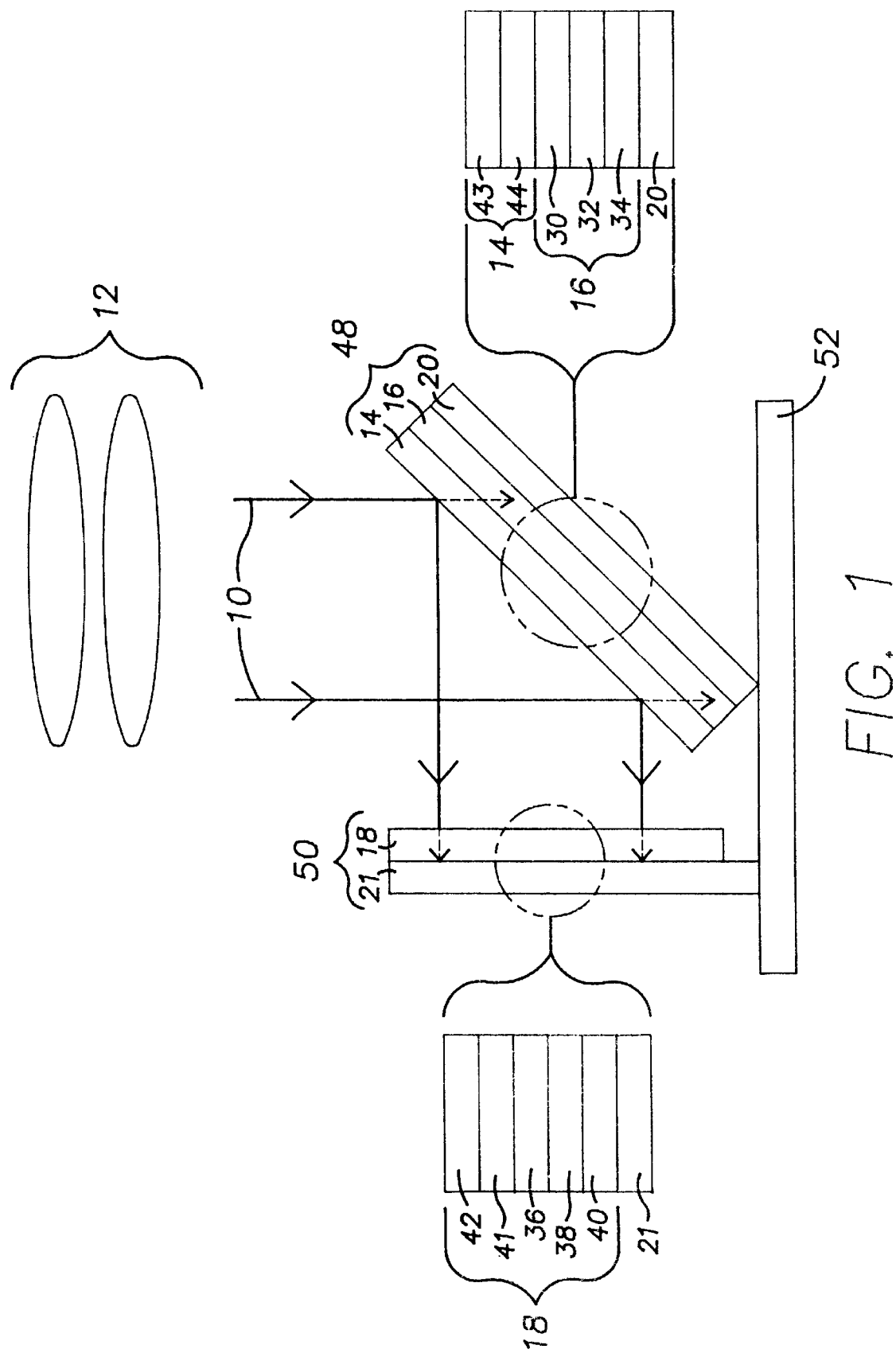
FIG. 1 is an illustrative sectional view of one embodiment of the invention in which a spectrally selective reflector is used to partition incoming light rays between two solar cells.

As shown in the accompanying drawings, the present invention is a photovoltaic device that uses a spectrally selective photon partitioner such as a spectrally selective reflector for imaging photons towards different solar cells, depending upon their energy. Photon partitioners other than spectrally selective reflectors can be used to separate photons by energy (such as prisms and diffraction gratings), with solar cells being positioned to receive light accordingly. Incident sunlight, or more generally, photons, are represented in FIG. 1 by incoming light rays 10. The term light is used broadly herein to encompass both visible and invisible electromagnetic radiation. A solar concentrator system 12 is represented schematically by lenses and can be used to collect sunlight from a wide area and direct it (collimate and/or focus it) towards a spectrally selective reflector 14 that overlies a solar cell 16. In general, solar concentrators extend over a much wider area than the solar cells to which they image light. The spectrally selective reflector 14 is oriented preferably at 45 degrees to the sun and transmits those photons that can be converted into electricity by solar cell 16 while reflecting other photons towards another solar cell 18. Solar cells 16 and 18 overlie respective backplates 20 and 21 and can be individually sized and series connected to build desired cell circuits.

If solar cells 16 and 18 have high and low effective band gaps, respectively, then solar cell 16 will efficiently convert high energy photons while solar cell 18 efficiently converts low energy photons. In this case, the spectrally selective reflector 14 transmits high energy photons into solar cell 16 while reflecting low energy photons towards solar cell 18. Alternatively, solar cells 16 and 18 can be designed for low and high energy photons, respectively, in which case the spectrally selective reflector 14 transmits low energy photons while reflecting high energy photons towards solar cell 18. More precisely, the spectrally selective reflector 14 partitions photons such that photons with energies lying between the effective band gaps of solar cells 16 and 18 are imaged towards that solar cell that has the smaller effective band gap, whereas photons that are more energetic than either of the two band gaps are imaged towards that cell having the larger effective band gap. This partitioning of the photons efficiently converts the energy of the photons into electricity. Where photons with energies below the band gaps of both cells are imaged is not of immediate interest, since they cannot be converted into electricity in either cell.

Solar cells 16 and 18 may comprise a variety of materials formed by different techniques including molecular beam epitaxy and diffusion. Cutaways in FIG. 1 show in greater detail how solar cells 16 and 18, spectrally selective reflector 14 and backplates 20 and 21 are preferably constructed and their relationship to each other. Solar cell 16 is shown here as the high energy band gap cell which preferably comprises 5 micron thick layers of GaInP 30 and GaAs 32 grown on a substrate 34 that is preferably 170 micron thick Ge. Since GaInP and GaAs have band gaps of 1.85 eV and 1.45 eV, respectively, photons having wavelengths (as measured in vacuum) shorter than 0.67 microns are absorbed in the GaInP layer 30, whereas the GaAs layer 32 will produce electricity from photons passing through the GaInP layer 30 which have wavelengths between 0.67 and 0.89 microns. With this choice of semiconductors, solar cell 16 has an effective band gap defined by the GaAs layer 32, i.e. 1.45 eV, so that solar cell 16 converts photons having vacuum wavelengths less than 0.89 microns.

The low energy band gap cell is shown here as solar cell 18 and preferably includes 3–5 micron thick layers of GaInAsP 36 and alternatively GaInAs 38 as well grown on a substrate 40 that is preferably 350 micron thick InP. GaInAsP and GaInAs have band gaps of 1.03 and 0.74 eV, respectively, so that cell 18 has an effective band gap of 0.74 eV. That is, photons having wavelengths less than 1.3 microns will be absorbed in the GaInAsP layer 36, whereas the GaInAs layer 38 will produce electricity only from photons falling in the wavelength range between 1.3 and 1.7 microns. Photons having wavelengths longer than 1.7 microns cannot produce electron-hole pairs in GaInAs, since they are not energetic enough to promote an electron from the conduction band to the valence band. Other semiconductor materials can be used as low band gap materials, such as GaSb, Si, CuInGaSe and GaAs, whereas substrate 40 may also comprise materials such as Si or Ge. A substantially transparent glass layer 41 can be placed on top of the active semiconductor materials of solar cell 18 (or cell 16) to protect it from cosmic radiation. An anti-reflection coating 42 for reducing infrared reflection may be applied to one or both sides of glass layer 41 or, when glass layer 41 is not used, directly onto the GaInAsP layer 36.

For the choice of semiconductor materials indicated in FIG. 1, the spectrally selective reflector 14 is designed to generally transmit photons having wavelengths less than 0.89 microns into solar cell 16, but generally reflect photons between 0.89 and 1.7 microns towards solar cell 18. The spectrally selective reflector 14 preferably includes a spectrally selective coating 43 applied to a substantially transparent glass layer 44 that in turn is bonded to the solar cell 16 with an optically transparent adhesive such as Dow Corning Inc. type 93-500. Coating 43 may also be applied directly to solar cell 16, however, and may be a multilayer coating comprising a series of $TiO_2$ and $SiO_2$ layers. Alternatively, it may be a single layer with a spatially varying refractive index. The spectrally selective reflector 14 permits photons to be more directly imaged towards those semiconductor layers in which they generate electricity than do tandem cells in which transparent adhesive layers are used to join the semiconductor layers. This approach substantially reduces absorption of the incident sunlight by free carriers, thereby increasing the overall solar to electrical energy conversion efficiency. Furthermore, it permits low cost Ge to be used as the substrate 34 for the GaInP and GaAs layers 30 and 32, rather than the more expensive GaAs, which would otherwise be required because of its better transmission properties in the infrared.

Backplates 20 and 21 provide a mechanical platform for solar cells 16 and 18. For space applications, the backplates 20 and 21 are preferably 250–500 micron thick graphite epoxy or metal such as copper, since these materials are relatively light-weight, rigid, and are effective absorbers of cosmic radiation. Solar cell 16, spectrally selective reflector 14 and backplate 20 form a solar panel 48, whereas solar cell 18 and backplate 21 form a solar panel 50. For space applications, the solar panels 48 and 50 can be mounted with hinges, brackets or other support structures (not shown in FIG. 1) to a facesheet 52 that is preferably 100–500 micron thick Kevlar™ or aluminum. The facesheet 52 can in turn be secured, for example, to an aluminum honeycomb structure like that commonly used to support solar panels in space.

Additional spectrally selective reflectors can be used to further subdivide incoming radiation among even more solar cells. For example, panel 50 could include a spectrally selective reflector that reflects light between 1.3 and 1.7 microns while transmitting light between 0.89 and 1.3 microns. In this case, GaInAs layer 38 would not be part of panel 50 but would form its own panel, and panel 50 would be oriented so that light between 1.3 and 1.7 microns would be reflected onto this GaInAs-containing panel.

Figure 2:
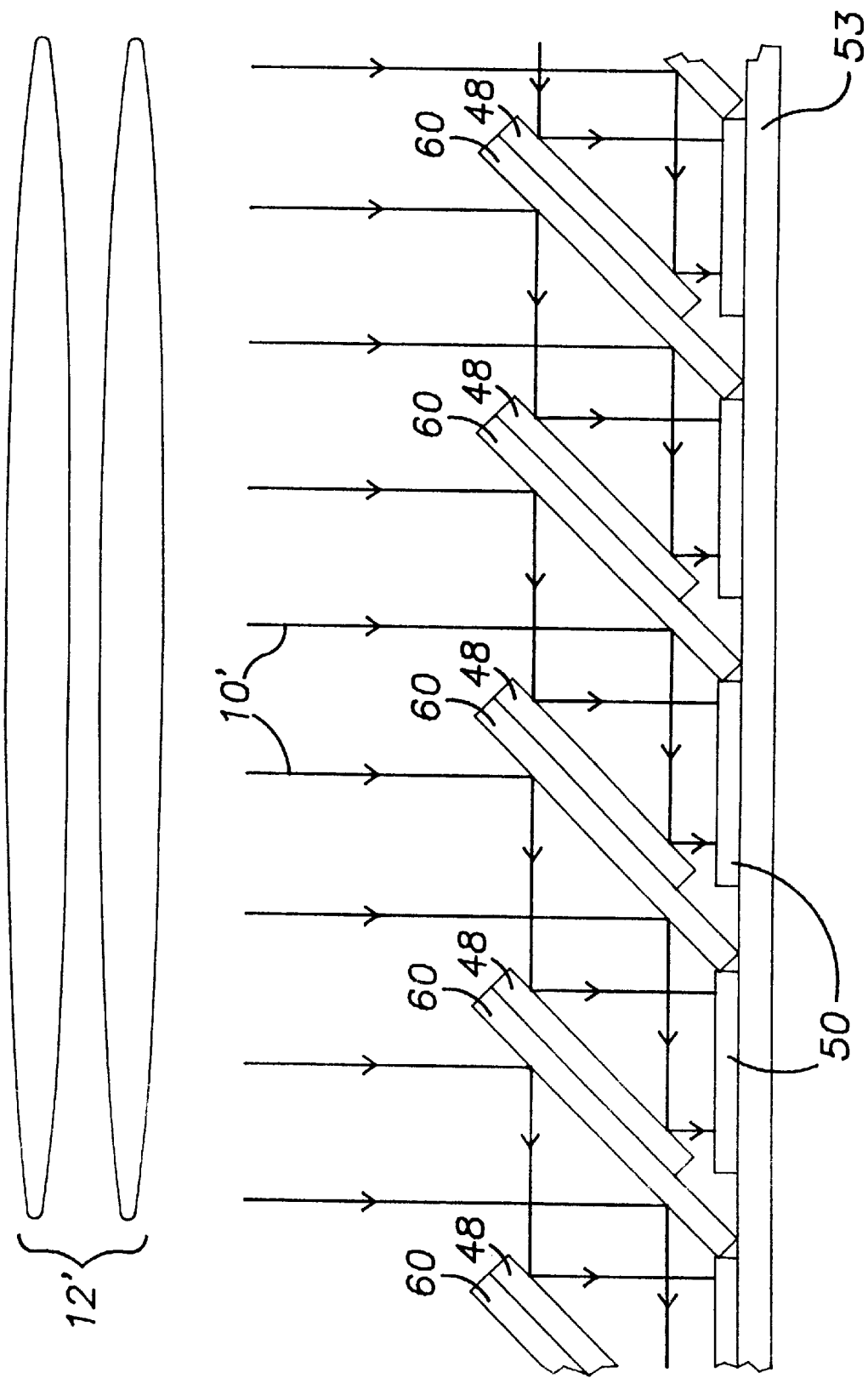
FIG. 2 is an illustrative sectional view of another embodiment of the invention which includes a broadband mirror that directs incoming light rays towards the spectrally selective reflector.

FIG. 2 shows an array of pairs of solar panels 48 and 50, in which each pair of panels is used in conjunction with a mirror 60 that is preferably oriented at 45 degrees to incident sunlight. The mirrors 60 are preferably substantially flat, broadband reflectors that reflect those photons that can be converted into electricity. Aluminized Mylar bonded to a supporting medium or polished aluminum by itself can be used for this purpose. An optional solar concentrator system 12' is represented schematically by lenses and can be used to collect sunlight from a wide area and direct it (collimate and/or focus it) towards the mirrors 60. System 12' preferably extends over a much larger area than that represented by the panels 48 and 50.

Light rays 10' are reflected by mirrors 60 towards solar panels 48, which include solar cells 16 and spectrally selective reflectors 14, as shown in FIG. 1. As in FIG. 1, the spectrally selective reflectors 14 redirect those photons that can be efficiently converted by solar cells 18 towards solar panels 50. Solar panels 48 and 50 and mirrors 60 are preferably arranged in a close packing configuration as shown in FIG. 2, in which panels 48 and mirrors 60 adjoin but face away from each other, and have approximately the same length. Solar panels 50, on the other hand, are preferably oriented perpendicular to light rays 10', and collect the photon flux reflected from the spectrally selective reflectors 14. As in FIG. 1, a facesheet 53 (that is like its counterpart 52) can be used to support solar panels 48 and 50 and mirrors 60. By attaching hinges (not shown) between the facesheet 53 and each solar panel 48/mirror 60 pair, the solar panels 48 and mirrors 60 can be permitted to rest on the solar panels 50 during storage, and then raised prior to use with tensioning cords (not shown) that are also attached to the facesheet 53 and the solar panels 48 and mirrors 60. This is an important advantage for extra-terrestrial applications, in which efficient use of space is critical. This embodiment can also be used in conjunction with a solar concentrator system that collects photons over a wide area and focuses them towards the mirrors 60.

An advantage of the configuration illustrated in FIG. 2 is that the solar cells can be better shielded from cosmic radiation that would otherwise damage them. As long as mirrors 60 are oriented towards the sun, cosmic radiation emanating from the sun must pass through one of the mirrors 60 as well as one of the backplates 20 and one of the substrates 34 in solar panel 48 (shown in FIG. 1) before reaching active semiconductor layers. This reduces the need for glass to form a radiation shield, which is heavy and yellows in time as it absorbs radiation, leading to reduced transmission. Nevertheless, glass layers such as layer 41 can still be used if desired to shield the active semiconductor layers of solar cells 16 and 18 from cosmic radiation that propagates at an oblique angle with respect to light rays 10'.

While particular embodiments of the invention have been shown and described, numerous variations and alternate embodiments will occur to those skilled in the art. Accordingly, it is intended that the invention be limited only in terms of the appended claims.

We claim:

1. A spectrum-partitioning photovoltaic device for conversion of photons into electrical energy, comprising:

first and second solar cells that each have a cell face and respectively have a first band gap and a greater second band gap; and a spectrally selective coating on the cell face of a selected one of said first and second solar cells with said coating configured and said selected solar cell positioned to direct photons with energies less than said second band gap to said first solar cell and to direct other photons to said second solar cell.

2. The photovoltaic device of claim 1, wherein said spectrally selective coating reflects photons to one of said first and second solar cells.

3. The photovoltaic device of claim 1, wherein said coating includes;

$TiO_2$ layers; and $SiO_2$ layers.

4. The photovoltaic device of claim 1, wherein said coating has a spatially-varying refractive index.

5. The photovoltaic device of claim 1, further including an antireflection coating on the cell face of at least one of said first and second solar cells.

6. The photovoltaic device of claim 1, wherein said second solar cell includes:

GaInP and GaAs layers; and a Ge substrate.

7. The photovoltaic device of claim 1, wherein said first solar cell includes:

semiconductor layers selected from a group consisting of GaInAsP, GaInAs, GaSb, Si, CuInGaSe and GaAs; and a substrate of a semiconductor selected from a group consisting of InP, Si and Ge.

8. The photovoltaic device of claim 1, further comprising a solar concentrator system for collecting said photons and directing them towards said spectrally selective coating.

9. The photovoltaic device of claim 1, further including a backplate that adjoins at least one of said solar cells and is formed from a material that absorbs cosmic radiation.

10. A solar panel array for conversion of photons into electrical energy, comprising:

a plurality of solar cell assemblies that each include:

a) a first solar panel formed with first solar cells which each have a first band gap;

b) a second solar panel positioned proximate to said first solar panel and formed with second solar cells which each have a second band gap that exceeds said first band gap;

c) a mirror having a back face that carries a selected one of said first and second solar panels and a reflecting face that is positioned to reflect a portion of said photons into a reflected-photon stream; and d) a spectrally selective partitioner;

wherein each solar cell assembly is positioned adjacent to another solar cell assembly;

and wherein the spectrally selective partitioner of each solar cell assembly is positioned to receive the reflected photon stream of an adjacent solar cell assembly and to direct photons with energies less than said second band gap to said first solar panel and to direct other photons to said second solar panel.

11. The solar panel array of claim 10, further comprising a solar concentrator system for collecting said incoming photons and directing them towards the mirror of each of said solar cell assemblies.

12. The solar panel array of claim 10, further including a face sheet and wherein each of said solar panel assemblies is supported by said face sheet.

13. The solar panel array of claim 10, wherein said spectrally selective partitioner is a spectrally selective coating on said selected solar panel.

14. The solar panel array of claim 10, wherein each of said solar cell assemblies includes a glass layer carried by said selected solar panel and said spectrally selective partitioner is a spectrally selective coating on said glass layer.

15. The solar panel array of claim 10 wherein said spectrally selective partitioner includes;

$TiO_2$ layers; and $SiO_2$ layers.

16. The solar panel array of claim 10, wherein said spectrally selective partitioner has a spatially-varying refractive index.

17. The solar panel array of claim 10, further including an antireflection coating on the cell face of at least one of said first and second solar cells.

18. The solar panel array of claim 10, wherein said second solar cells each include:

GaInP and GaAs layers; and a Ge substrate.

19. The solar panel array of claim 10, wherein said first solar cells each include:

semiconductor layers selected from a group consisting of GaInAsP, GaInAs, GaSb, Si, CuInGaSe and GaAs; and a substrate of a semiconductor selected from a group consisting of InP, Si and Ge.

20. The solar panel array of claim 10, wherein each of said solar cell assemblies includes a backplate that supports at least one of said solar panels and is formed from a material that absorbs cosmic radiation.

* * * * *